United States Patent
Wang

(10) Patent No.: US 10,679,577 B2
(45) Date of Patent: Jun. 9, 2020

(54) SHIFT REGISTER AND DRIVING METHOD THEREOF

(71) Applicant: BOE TECHNOLOGY GROUP CO., LTD., Beijing (CN)

(72) Inventor: Zhiliang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/745,107

(22) PCT Filed: Aug. 31, 2017

(86) PCT No.: PCT/CN2017/099876
§ 371 (c)(1),
(2) Date: Jan. 15, 2018

(87) PCT Pub. No.: WO2018/145448
PCT Pub. Date: Aug. 16, 2018

(65) Prior Publication Data
US 2019/0355317 A1  Nov. 21, 2019

(30) Foreign Application Priority Data

Feb. 10, 2017 (CN) .......................... 2017 1 0073503

(51) Int. Cl.
*G09G 3/36* (2006.01)
*G11C 19/28* (2006.01)

(52) U.S. Cl.
CPC ......... *G09G 3/3614* (2013.01); *G09G 3/3677* (2013.01); *G11C 19/28* (2013.01);
(Continued)

(58) Field of Classification Search
CPC ......... G09G 2310/0286; G09G 3/3677; G09G 3/3614; G09G 2300/0842; G09G 2300/0426; G09G 3/3266; G11C 19/28
See application file for complete search history.

(56) References Cited

U.S. PATENT DOCUMENTS 9,230,482 B2 * 1/2016 Lee ...................... G11C 19/184
9,368,230 B2 * 6/2016 Yao ...................... G11C 19/184
(Continued)

FOREIGN PATENT DOCUMENTS

| CN | 104299652 A | 1/2015 |
| CN | 105304021 A | 2/2016 |
| WO | WO2017045390 | * 3/2017 |

OTHER PUBLICATIONS

1st Office Action dated May 29, 2019 in CN201710073503.5.
(Continued)

*Primary Examiner* — Benyam Ketema
(74) *Attorney, Agent, or Firm* — Syncoda LLC; Feng Ma

(57) ABSTRACT

A shift register and a driving method thereof. The shift register includes a first control circuit, a second control circuit, a third control circuit and an output control circuit. The first control circuit is connected to a signal input end, a first clock signal input end, a first level signal end, a first node and a third node. The second control circuit is connected to the first clock signal end, a second level signal end, the first node and a second node. The third control circuit is connected to a second clock signal end, the first level signal end, the first node, the second node and the third node. The output control circuit is connected to the second clock signal end, the first level signal end, the first node, the second node and a signal output end.

20 Claims, 7 Drawing Sheets

(52) U.S. Cl.
CPC .............. *G09G 2300/0426* (2013.01); *G09G 2300/0842* (2013.01); *G09G 2310/0286* (2013.01)

(56) References Cited

U.S. PATENT DOCUMENTS

| | | | | |
|---|---|---|---|---|
| 9,881,543 | B2* | 1/2018 | Ma | G11C 19/28 |
| 10,210,840 | B2* | 2/2019 | Wang | G09G 5/003 |
| 2008/0062097 | A1* | 3/2008 | Jeong | G09G 3/3266 345/84 |
| 2014/0078029 | A1* | 3/2014 | Jang | G09G 3/32 345/82 |
| 2014/0079176 | A1* | 3/2014 | Qian | G11C 19/28 377/77 |
| 2014/0285108 | A1* | 9/2014 | Kim | G09G 3/3266 315/291 |
| 2015/0339999 | A1* | 11/2015 | Zheng | G11C 19/28 345/92 |
| 2016/0019976 | A1* | 1/2016 | Pai | G09G 3/3266 345/204 |
| 2016/0210925 | A1* | 7/2016 | Chung | G09G 3/3677 |
| 2016/0372069 | A1* | 12/2016 | Lv | G09G 3/36 |
| 2017/0004888 | A1* | 1/2017 | Ma | G11C 19/28 |
| 2017/0330633 | A1* | 11/2017 | Sun | G11C 19/28 |
| 2018/0130541 | A1* | 5/2018 | Li | G09G 5/003 |
| 2018/0233209 | A1* | 8/2018 | Ma | G11C 19/28 |
| 2018/0254091 | A1* | 9/2018 | Zhang | G11C 19/184 |

OTHER PUBLICATIONS

International Search Report and Written Opinion dated Nov. 29, 2017 in PCT/CN2017/099876.
2nd Office Action dated Jan. 17, 2020 in CN201710073503.5.

* cited by examiner

SHIFT REGISTER AND DRIVING METHOD THEREOF

CROSS-REFERENCE TO RELATED APPLICATIONS

This application claims priority to Chinese Patent Application No. 201710073503.5 filed on Feb. 10, 2017, the entire contents of which are incorporated herein by reference.

TECHNICAL FIELD

The disclosure relates to the field of display technologies, and particularly relates to a shift register and a driving method thereof.

BACKGROUND

When a liquid crystal display performs displaying, a signal is output through a driving circuit inside the liquid crystal display to scan pixel units of the liquid crystal display row by row so as to display an image. The liquid crystal display mainly implements the row by row scanning of images through a shift register.

SUMMARY

In one aspect, the present invention provides a shift register comprising: a first control circuit coupled to a signal input end, a first clock signal input end, a first level signal end, a first node and a third node, and configured to control, under control of a signal input by the first clock signal end and a voltage level of the third node, a voltage level of the first node according to signals from the first level signal end and the signal input end; a second control circuit coupled to the first clock signal end, a second level signal end, the first node and a second node, and configured to control, under control of the signal input by the first clock signal end and the voltage level of the first node, a voltage level of the second node according to signals from the first clock signal end and the second level signal end; a third control circuit coupled to a second clock signal end, the first level signal end, the first node, the second node and the third node, and is configured to control, under control of the voltage level of the first node and the voltage level of the second node, a voltage level of the third node according to signals from the second clock signal end and the first level signal end; and an output control circuit coupled to the second clock signal end, the first level signal end, the first node, the second node and a signal output end, and configured to control, under control of the voltage level of the first node and the voltage level of the second node, a voltage level of the signal output end according to signals from the second clock signal end and the first level signal end.

Optionally, the signal input by the first level signal end has an opposite polarity to an operating level, and the signal input by the second level signal end has a same polarity as the operating level.

Optionally, the first control circuit comprises a first transistor having a first electrode connected to the first node, a second electrode connected to the signal input end, and a control electrode connected to the first clock signal end; and a second transistor having a first electrode connected to the first level signal end, a second electrode connected to the first node, and a control electrode connected to the third node.

Optionally, the second control circuit comprises a fifth transistor having a first electrode connected to the first clock signal end, a second electrode connected to the second node, and a control electrode connected to the first node; and a sixth transistor has a first electrode connected to the second node, a second electrode connected to the second clock signal end, and a control electrode connected to the first clock signal end.

Optionally, the third control circuit comprises a third transistor having a first electrode connected to the first level signal end, a second electrode connected to the third node, and a control electrode connected to the first node; and a fourth transistor having a first electrode connected to the third node, a second electrode connected to the second clock signal end, and a control electrode connected to the second node.

Optionally, the output control circuit comprises a seventh transistor having a first electrode connected to the first level signal end, a second electrode connected to the signal output end, and a control electrode connected to the second node; and an eighth transistor having a first electrode connected to the signal output end, a second electrode connected to the second clock signal end, and a control electrode connected to the first node.

Optionally, the output control circuit further comprises a first storage capacitor having a first end connected to the first node, and a second end connected to the signal output end.

Optionally, the output control circuit further comprises a second storage capacitor having a first end connected to the first level signal end, and a second end connected to the second node.

Optionally, the first control circuit comprises a first transistor and a second transistor, the second control circuit comprises a fifth transistor and a sixth transistor, the third control circuit comprises a third transistor and a fourth transistor, and the output control circuit comprises a seventh transistor and an eighth transistor, wherein: the first transistor has a first electrode connected to the first node, a second electrode connected to the signal input end, and a control electrode connected to the first clock signal end; the second transistor has a first electrode connected to the first level signal end, a second electrode connected to the first node and a control electrode connected to the third node; the third transistor has a first electrode connected to the first level signal end, a second electrode connected to the third node, and a control electrode connected to the first node; the fourth transistor has a first electrode connected to the third node, a second electrode connected to the second clock signal end, and a control electrode connected to the second node; the fifth transistor has a first electrode connected to the first clock signal end, a second electrode connected to the second node, and a control electrode connected to the first node; the sixth transistor has a first electrode connected to the second node, a second electrode connected to the second clock signal end, and a control electrode connected to the first clock signal end; the seventh transistor has a first electrode connected to the first level signal end, a second electrode connected to the signal output end, and a control electrode connected to the second node; and the eighth transistor has an first electrode connected to the signal output end, an second electrode connected to the second clock signal end, and an control electrode connected to the first node.

Optionally, the signal input by the first level signal end has an opposite polarity to an operating level, and the signal input by the second level signal end has a same polarity as the operating level, when the first transistor, the second transistor, the third transistor, the fourth transistor, the fifth transistor, the sixth transistor, the seventh transistor and the eighth transistor all are P type transistors, the operating level is a low level signal; and when the first transistor, the second transistor, the third transistor, the fourth transistor, the fifth transistor, the sixth transistor, the seventh transistor and the eighth transistor all are N type transistors, the operating level is a high level signal.

In another aspect, the present invention provides a method for driving the shift register described herein, comprising: inputting an operating level signal to a first clock signal end and a signal input end; controlling, through a first control circuit, a first node to have a the same polarity as an operating level; controlling, through a second control circuit, a second node to have a same polarity as the first node; and controlling, through a third control circuit, a third node to have an opposite polarity to the first node; inputting the operating level signal to a second clock signal end, inputting, to the first clock signal end, a first signal having an opposite polarity to the operating level; controlling, through the second control circuit, the second node to have the opposite polarity to the operating level; controlling, through the third control circuit, the third node to have the same polarity as the operating level; and controlling, through the output control circuit, the signal output end to output an output signal having the same polarity as the operating level; and inputting the operating level signal to the first clock signal end, inputting, to the second clock signal end, a second signal having the opposite polarity to the operating level; controlling, through the first control circuit, the first node to have the opposite polarity to the operating level; controlling, through the second control circuit, the second node to have the same polarity as the operating level; controlling, through the third control circuit, the third node to have the opposite polarity to the operating level; and controlling, through the output control circuit, the signal output end to output the output signal having the opposite polarity to the operating level.

In another aspect, the present invention provides a grid driving circuit comprising a plurality of shift registers described herein that are in cascaded connection.

In another aspect, the present invention provides a display device comprising a grid driving circuit described herein.

BRIEF DESCRIPTION OF DRAWINGS

The accompanying drawings herein are incorporated in and become parts of the specification, illustrate embodiments consistent with the disclosure and, together with the description, serve to explain the principles of the disclosure.

Figure 1:
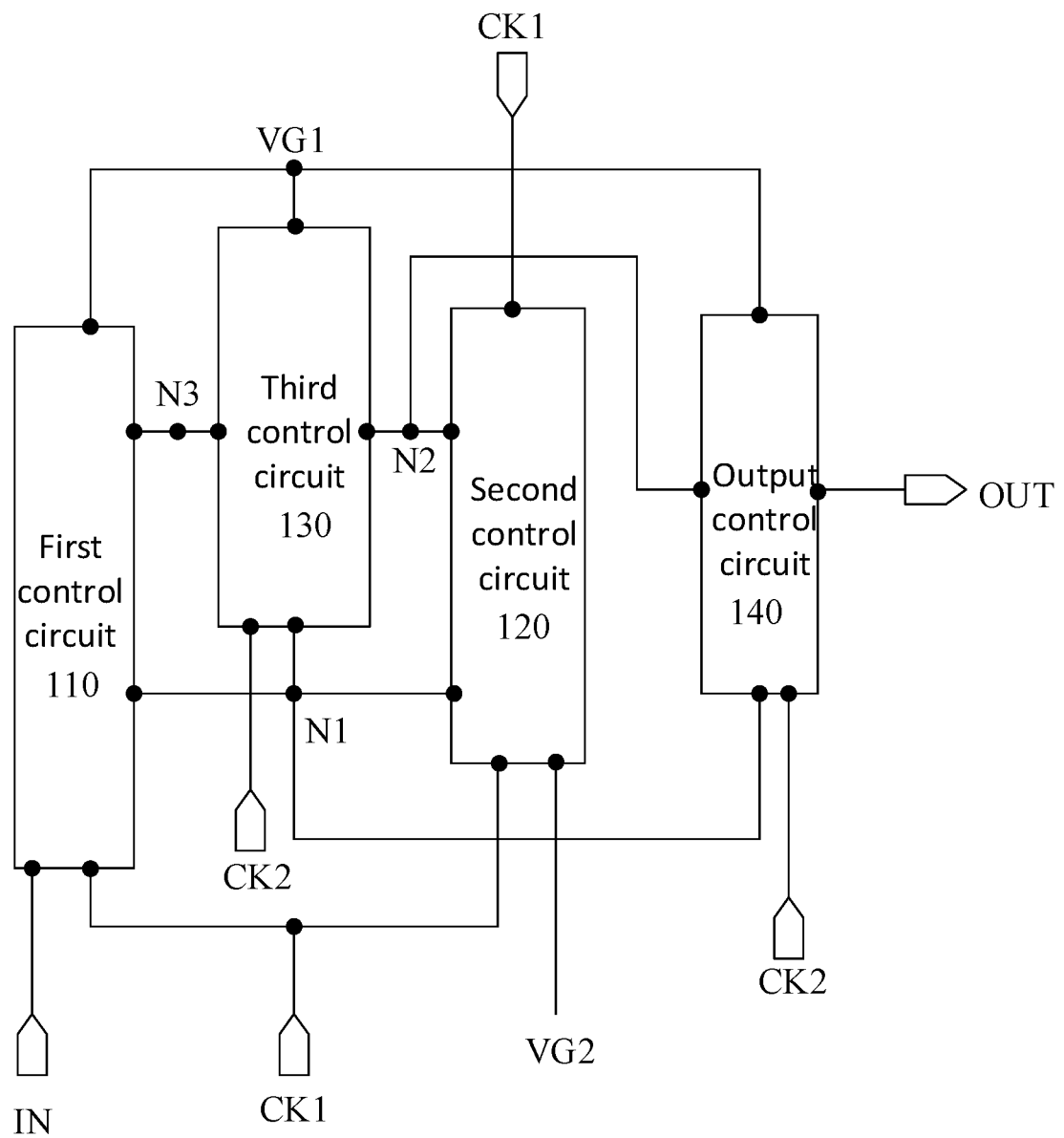
FIG. 1 is a structure diagram of a shift register of a first embodiment of the disclosure 1.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

To help those skilled in the art better understand the technical scheme of the disclosure, the disclosure is described below in further detail in conjunction with accompanying drawings and specific embodiments.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

In general, a shift register may be a driving circuit composed of a plurality of transistors and other electrical components that are connected to each other. For some shift registers, during some operating phases, the control electrode potential of each transistor probably is in a suspended state. Thus, such structure may cause a circuit to be unstable. Therefore, it is desired to provide a shift register capable of solving this problem.

As shown in FIG. 1, this embodiment provides a shift register. The shift register includes: a first control circuit 110, a second control circuit 130, a third control circuit 120 and an output control circuit 140. The first control circuit 110 is connected to a signal input end IN, a first clock signal input end CK1, a first level signal end VG1, a first node N1 and a third node N3. The first control circuit 110 is configured to control, under the control of a signal input by the first clock signal end CK1 and the potential of the third node N3, the potential of the first node N1 according to signals input by the first level signal end VG1 and the signal input end IN.

The second control circuit 130 is connected to the first clock signal end CK1, a second level signal end VG2, the first node N1 and a second node N2. The second control circuit 130 is configured to control, under the control of the signal input by the first clock signal end CK1 and the potential of the first node N1, the potential of the second node N2 according to signals input by the first clock signal end CK1 and the second level signal end VG2.

The third control circuit 120 is connected to a second clock signal end CK2, the first level signal end VG1, the first node N1, the second node N2 and a third node N3. The third control circuit 120 is configured to control, under the control of the potentials of the first node N1 and the second node N2, the potential of the third node N3 according to signals input by the second clock signal end CK2 and the first level signal end VG1.

The output control circuit 140 is connected to the second clock signal end CK2, the first level signal end VG1, the first node N1, the second node N2 and a signal output end OUT. The output control circuit 140 is configured to control, under the control of the potentials of the first node N1 and the second node N2, the potential of the signal output end OUT according to signals input by the second clock signal end CK2 and the first level signal end VG1. The signal input by the first level signal end VG1 has an opposite polarity to an operating level. The signal input by the second level signal end VG2 has a same polarity as the operating level.

Optionally, the first level signal end VG1 may be a high level signal end VGH. The second level signal end VG2 may be a low level signal end VGL. Optionally, the first level signal end VG1 may be a low level signal end VGL. The second level signal end VG2 may be a high level signal end VGH.

The driving method of the shift register in this embodiment specifically may include the following steps.

Phase 1: an operating level signal is input to the first clock signal end CK1 and the signal input end IN. The potential of the first node N1 is controlled, by controlling, through the first control circuit, to have a same polarity as the operating level. The potential of the second node N2 is controlled, through the second control circuit, to have a same polarity as the potential of the first node N1. The potential of the third node N3 is controlled, through the third control circuit, to have an opposite polarity to the potential of the first node N1.

Phase 2 (i.e., the operating stage of the shift register): the operating level signal is input to the second clock signal end CK2, and a signal having an opposite polarity to the operating level is input to the first clock signal end CK1. The potential of the second node N2 is controlled, through the second control circuit, to have an opposite polarity to the operating level. The potential of the third node N3 is controlled, through the third control circuit 120, to have a same polarity as the operating level. The signal output end OUT is controlled, through the output control circuit, to output a signal having a same polarity as the operating level.

Phase 3: the operating level signal is input to the first clock signal end CK1, and a signal having an opposite polarity to the operating level is input to the second clock signal end CK2. The potential of the first node N1 is controlled, through the first control circuit 110, to have an opposite polarity to the operating level. The potential of the second node N2 is controlled, through the second control circuit 130, to have a same polarity as the operating level. The potential of the third node N3 is controlled, through the third control circuit 120, to have an opposite polarity to the operating level. The signal output end OUT is controlled, through the output control circuit 140, to output a signal having an opposite polarity to the operating level.

The potentials or the signal levels of the first node N1, the second node N2 and the third node N3 in the shift register of this embodiment all are controlled by the first control circuit, the second control circuit and the third control circuit correspondingly, so that each node of the shift register is capable of maintaining a stable voltage in each phase, thereby making the work of the shift register stable.

To make the structure and operating principle of the shift register in the embodiment better understood, the shift register is described below in conjunction with following embodiments.

Figure 2:
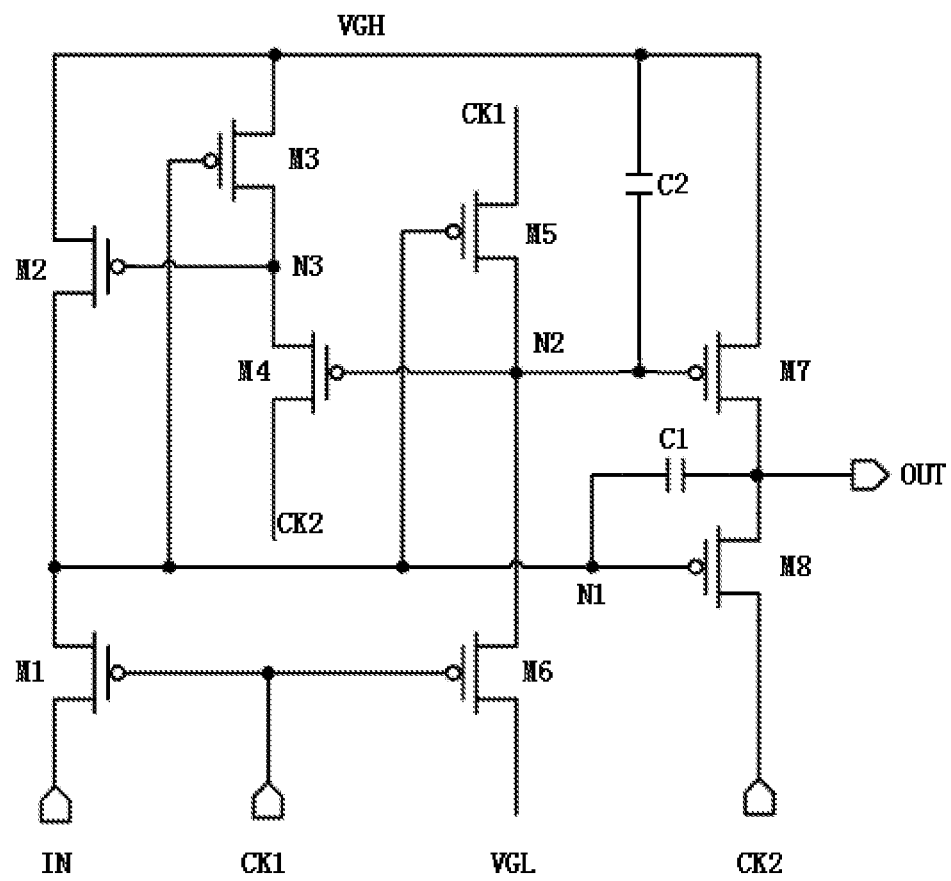
FIG. 2 is a circuit schematic diagram of a shift register of a second embodiment of the disclosure.

As shown in FIG. 2, this embodiment provides a shift register. The shift register includes a first control circuit, a second control circuit, a third control circuit and an output control circuit.

The first control circuit may include a first transistor M1 and a second transistor M2. The first transistor M1 has a first electrode connected to a first node N1, a second electrode connected to a signal input end IN, and a control electrode connected to a first clock signal end CK1. The second transistor M2 has a first electrode connected to the high level signal end VGH, a second electrode connected to the first node N1 and a control electrode connected to a third node N3.

The second control circuit may include a fifth transistor M5 and a sixth transistor M6. The fifth transistor M5 has a first electrode connected to the first clock signal end CK1, a second electrode connected to the second node N2, and a control electrode connected to the first node N1. The sixth transistor M6 has a first electrode connected to the second node N2, a second electrode connected to the low level signal end VGL, and a control electrode connected to the first clock signal end CK1.

The third control circuit may include a third transistor M3 and a fourth transistor M4. The third transistor M3 has a first electrode connected to the high level signal end VGH, a second electrode connected to the third node N3, and a control electrode connected to the first node N1. The fourth transistor M4 has a first electrode connected to the third node N3, a second electrode connected to the second clock signal end CK2, and a control electrode connected to the second node N2.

The output control circuit may include a seventh transistor M7 and an eighth transistor M8. The seventh transistor M7 has a first electrode connected to the high level signal end VGH, a second electrode connected to a signal output end OUT, and a control electrode connected to the second node N2. The eighth transistor M8 has a first electrode connected to the signal output end OUT, a second electrode connected to the second clock signal end CK2, and a control electrode connected to the first node N1. The output control circuit may further include a first storage capacitor C1 and a second storage capacitor C2. The first storage capacitor C1 has a first end connected to the first node N1, and a second end connected to the signal output end OUT. The second storage capacitor C1 has a first end connected to the low level signal end VGL, and a second end connected to the second node N2.

In this embodiment, each of the above transistors is a P type transistor, and the operating level is a low level signal. At this point, the signal input by the first level signal end VG1 is a high level signal, that is, the first level signal end VG1 is a high level signal end VGH. Correspondingly, the signal input by the second level signal end VG2 is a low level signal, that is, the second level signal end VG2 is a low level signal end VGL. The operating principle of the above shift register is described below in conjunction with the following operating process.

Figure 3:
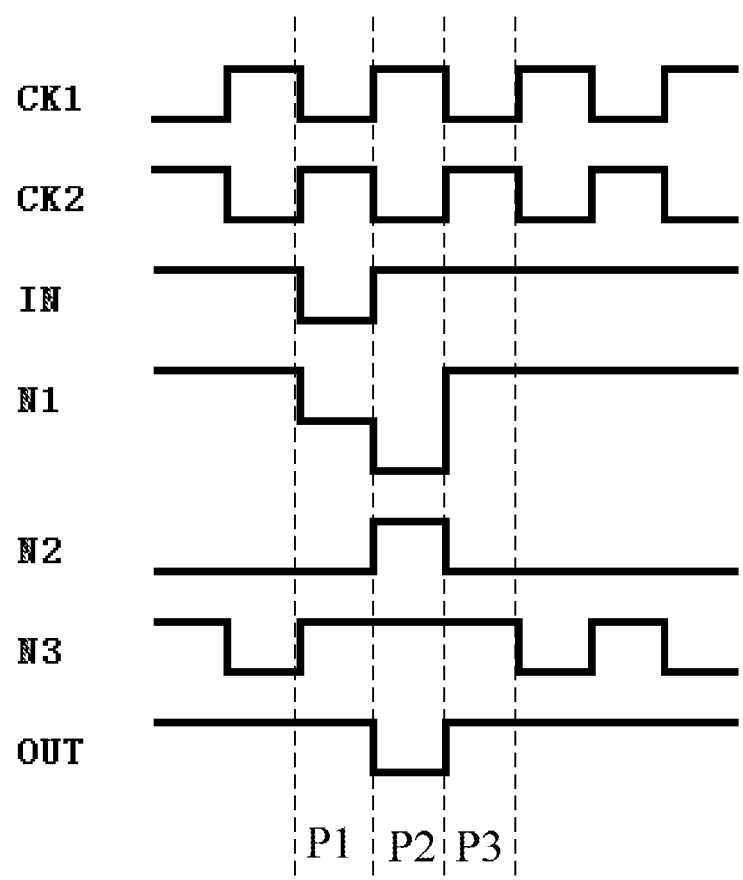
FIG. 3 is an operating sequence diagram of the circuit of the shift register of FIG. 2.

As shown in FIG. 2 and FIG. 3, Phase 1 (P1): a low level signal is input to the first clock signal end CK1 and a high level signal is input to the second clock signal end CK2. At this point, the first transistor M1 and the sixth transistor M6 are turned on, the signal input end IN inputs a low level signal and transmits the low level signal to the first node N1 through the first transistor M1, so that the potential of the first node N1 is of low level. At this point, the eighth transistor M8 is turned on, the second electrode of the eighth transistor M8 is connected to the second clock signal end CK2, and thus the signal output end OUT outputs a high level signal. Meanwhile, the second electrode of the sixth transistor M6 is connected to the low level signal end VGL, and the low level signal input by the low level signal end VGL is transmitted to the second node N2 through the sixth transistor M6, so that the second node N2 is of low level. Since the control electrode of the fourth transistor M4 is connected to the second node N2, the fourth transistor M4 is turned on too, and the second electrode of the fourth transistor M4 is connected to the second clock signal end CK2, the third node M3 is of high level at this point. Therefore, the second transistor M2 is in off state, so as to guarantee that the first node N1 is of stable low level.

Phase 2 (P2): a high level signal is input to the first clock signal end CK1 and a low level signal is input to the second clock signal end CK2. At this point, the first transistor M1 is turned off, the first storage capacitor C1 pulls the potential of the first node N1 down to a lower level through bootstrap, the eighth transistor M8 is turned on, and the signal output end OUT outputs a low level signal. Meanwhile, the fifth transistor M5 is turned on, the second node N2 is of high level, the third transistor M3 is turned on, the third node is of high level, and the second transistor M2 is turned off, so as not to influence the potential of the first node N1.

Phase 3 (P3): a low level signal is input to the first clock signal end CK1 and a high level signal is input to the second clock signal end CK2. At this point, the first transistor M1 and the sixth transistor M6 are turned on, the signal input end IN inputs a high level signal and transmits the high level signal to the first node N1 through the first transistor M1, so that the potential of the first node N1 is of high level. Since the sixth transistor M6 is turned on, the potential of the second node N2 is of low level. At this point, the fourth transistor M4 and the seventh transistor M7 are turned on. Since the seventh transistor M7 is turned on, the signal output end OUT outputs a high level signal. The fourth transistor M4 is turned on, the third node N3 is of high level, and at this point the second transistor M2 is turned off. Since the first transistor M1 keeps being turned on at this point, the first node N1 is of stable high level.

Thus it can be seen that the potentials of the first node N1, the second node N2 and the third node N3 all can keep a stable level in the above first, second and third phases, so that the circuit of the shift register is stable.

Figure 4:
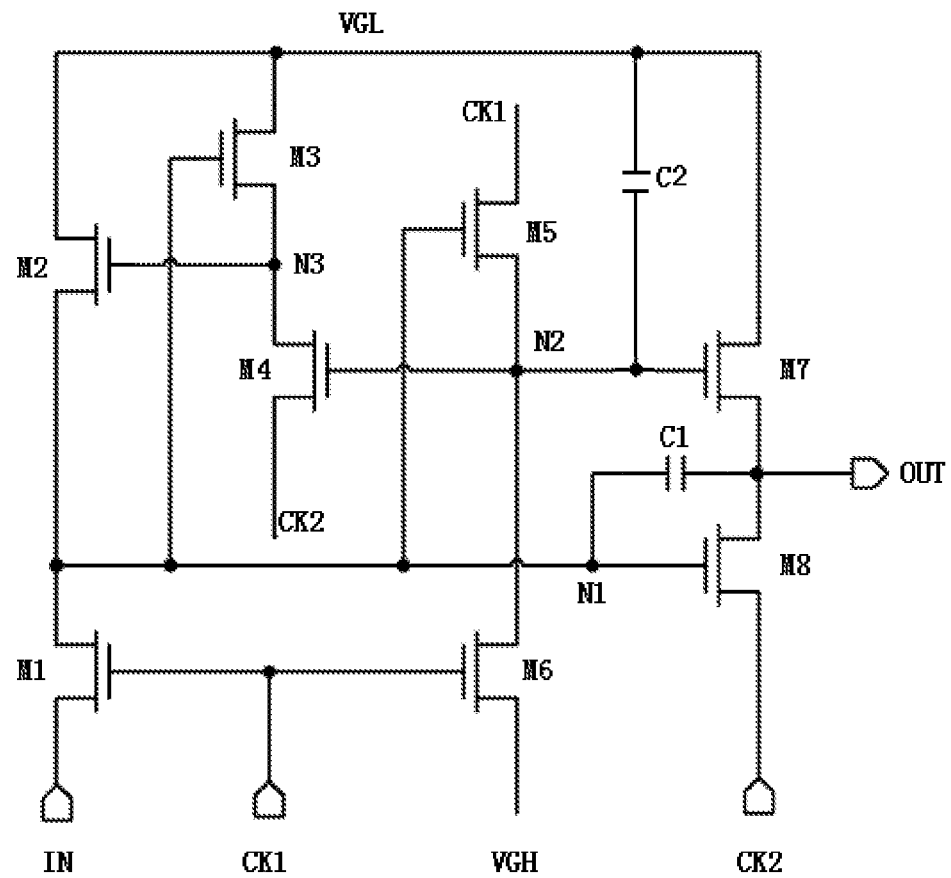
FIG. 4 is a circuit schematic diagram of a shift register of a third embodiment of the disclosure.

As shown in FIG. 4, this embodiment provides a shift register, which has an approximately same structure as provided in FIG. 2. The shift register includes a first control circuit, a second control circuit, a third control circuit and an output control circuit.

The first control circuit includes a first transistor M1 and a second transistor M2. The first transistor M1 has a first electrode connected to a first node N1, a second electrode connected to a signal input end IN, and a control electrode connected to a first clock signal end CK1. The second transistor M2 has a first electrode connected to the level signal end VGL, a second electrode connected to the first node N1 and a control electrode connected to a third node N3.

The second control circuit includes a fifth transistor M5 and a sixth transistor M6. The fifth transistor M5 has a first electrode connected to the first clock signal end CK1, a second electrode connected to a second node N2, and a control electrode connected to the first node N1. The sixth transistor M6 has a first electrode connected to the second node N2, a second electrode connected to the high level signal end VGH, and a control electrode connected to the first clock signal end CK1.

The third control circuit includes a third transistor M3 and a fourth transistor M4. The third transistor M3 has a first electrode connected to the high level signal end VGH, a second electrode connected to the third node N3, and a control electrode connected to the first node N1. The fourth transistor M4 has a first electrode connected to the third node N3, a second electrode connected to the second clock signal end CK2, and a control electrode connected to the second node N2.

The output control circuit includes a seventh transistor M7 and an eighth transistor M8. The seventh transistor M7 has a first electrode connected to the low level signal end VGL, a second electrode connected to a signal output end OUT, and a control electrode connected to the second node N2. The eighth transistor M8 has a first electrode connected to the signal output end OUT, a second electrode connected to the second clock signal end CK2, and a control electrode connected to the first node N1. The output control circuit may further include a first storage capacitor C1 and a second storage capacitor C2. The first storage capacitor C1 has a first end connected to the first node N1, and a second end connected to the signal output end OUT. The second storage capacitor C2 has a first end connected to the low level signal end VGL, and a second end connected to the second node N2.

In this embodiment, each of the above transistors is an N type transistor, and the operating level is a high level signal. At this point, the signal input by the first level signal end VG1 is a low level signal, that is, the first level signal end VG1 is a low level signal end VGL. Correspondingly, the signal input by the second level signal end VG2 is a high level signal, that is, the second level signal end VG2 is a high level signal end VGH. The operating principle of the above shift register is described below in conjunction with the following operating process.

Figure 5:
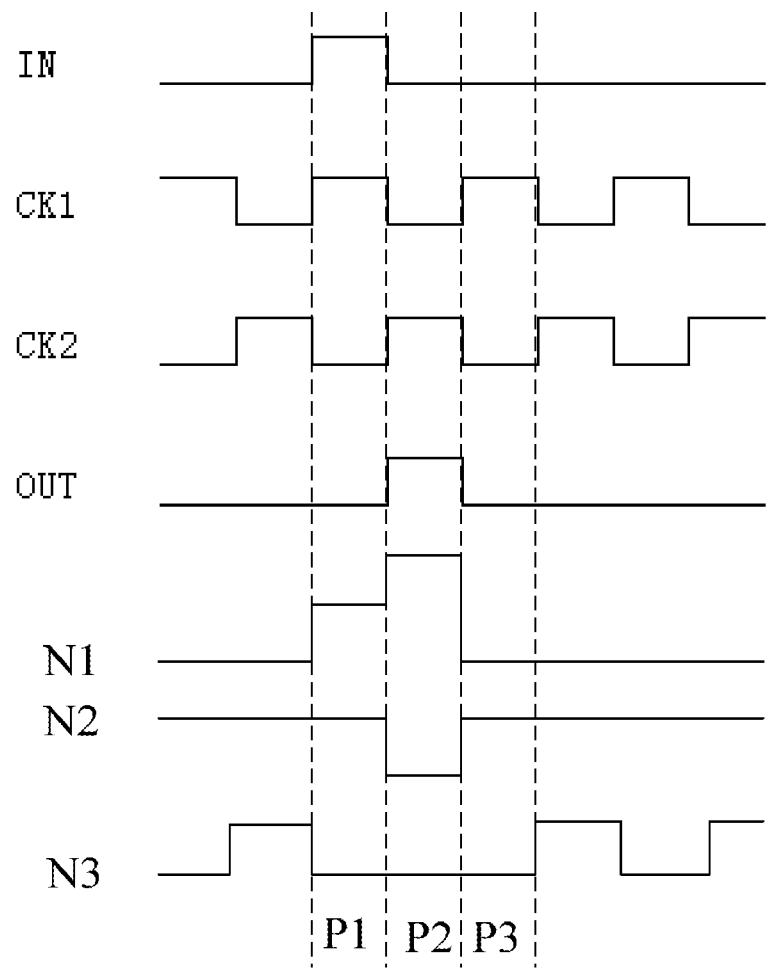
FIG. 5 is an operating sequence diagram of the circuit of the shift register of FIG. 4.

In conjunction with FIG. 4 and FIG. 5, Phase 1 (P1): a high level signal is input to the first clock signal end CK1 and a low level signal is input to the second clock signal end CK2. At this point, the first transistor M1 and the sixth transistor M6 are turned on, the signal input end IN inputs a high level signal and transmits the high level signal to the first node N1 through the first transistor M1, so that the potential of the first node N1 is of high level. At this point, the eighth transistor M8 is turned on, the second electrode of the eighth transistor M8 is connected to the second clock signal end CK2, and thus the signal output end OUT outputs a low level signal. Meanwhile, the second electrode of the sixth transistor M6 is connected to the high level signal end VGH, and the high level signal input by the high level signal end VGH is transmitted to the second node N2 through the sixth transistor M6, so that the second node N2 is of high level. Since the control electrode of the fourth transistor M4 is connected to the second node N2, the fourth transistor M4 is turned on too, and the second electrode of the fourth transistor M4 is connected to the second clock signal end CK2, the third node M3 is of low level at this point. Therefore, the second transistor M2 is in off state, so as to guarantee that the first node N1 is of stable high level.

Phase 2 (P2): a low level signal is input to the first clock signal end CK1 and a high level signal is input to the second clock signal end CK2. At this point, the first transistor M1 is turned off, the first storage capacitor C1 pulls the potential of the first node N1 up to a higher level through bootstrap, the eighth transistor M8 is turned on, and the signal output end OUT outputs a high level signal. Meanwhile, the fifth transistor M5 is turned on, the second node N2 is of low level, the third transistor M3 is turned on, the third node is of low level, and the second transistor M2 is turned off, so as not to influence the potential of the first node N1.

Phase 3 (P3): a high level signal is input to the first clock signal end CK1 and a low level signal is input to the second clock signal end CK2. At this point, the first transistor M1 and the sixth transistor M6 are turned on, the signal input end IN inputs a low level signal and transmits the low level signal to the first node N1 through the first transistor M1, so that the potential of the first node N1 is of low level. Since the sixth transistor M6 is turned on, the potential of the second node N2 is of high level, and at this point the fourth transistor M4 and the seventh transistor M7 are turned on. Since the seventh transistor M7 is turned on, the signal output end OUT outputs a low level signal. The fourth transistor M4 is turned on, the third node N3 is of high level. Since the first transistor M1 keeps being turned on at this point, the first node N1 is of stable low level.

Thus it can be seen that the potentials of the first node N1, the second node N2 and the third node N3 all can keep a stable level in the above first, second and third phases, so that the circuit of the shift register is stable.

Figure 6:
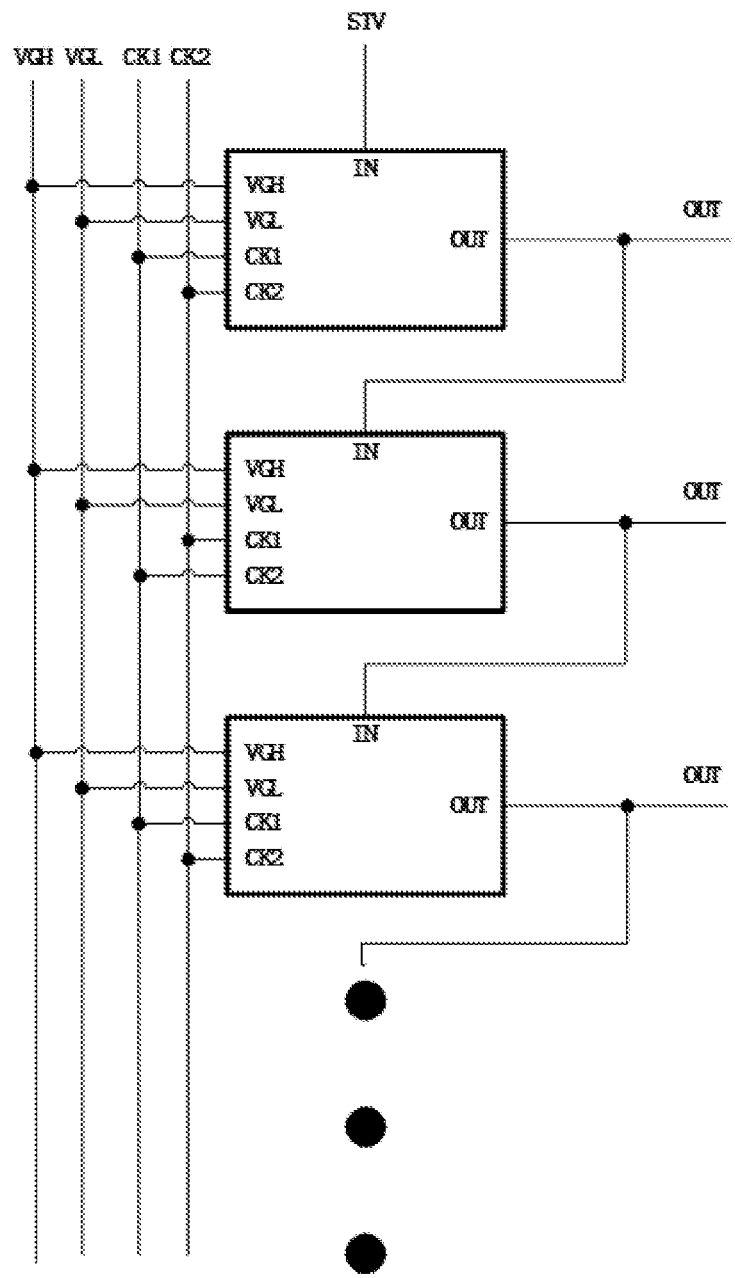
FIG. 6 is a structure diagram of a grid driving circuit of a fourth embodiment of the disclosure.

FIG. 6 provides a grid driving circuit and a display device. As shown in FIG. 6, the grid driving circuit includes multiple of shift registers described in the first embodiments to the third embodiment, and the shift registers are in cascaded connection. Herein, the signal input end IN of a shift register of one stage is connected to the signal output end OUT of a shift register of a previous stage. The signal output end OUT of a shift register of one stage is connected to the signal input end IN of a shift register of a next stage.

The display device in this embodiment includes the grid driving circuit described above.

Figure 7:
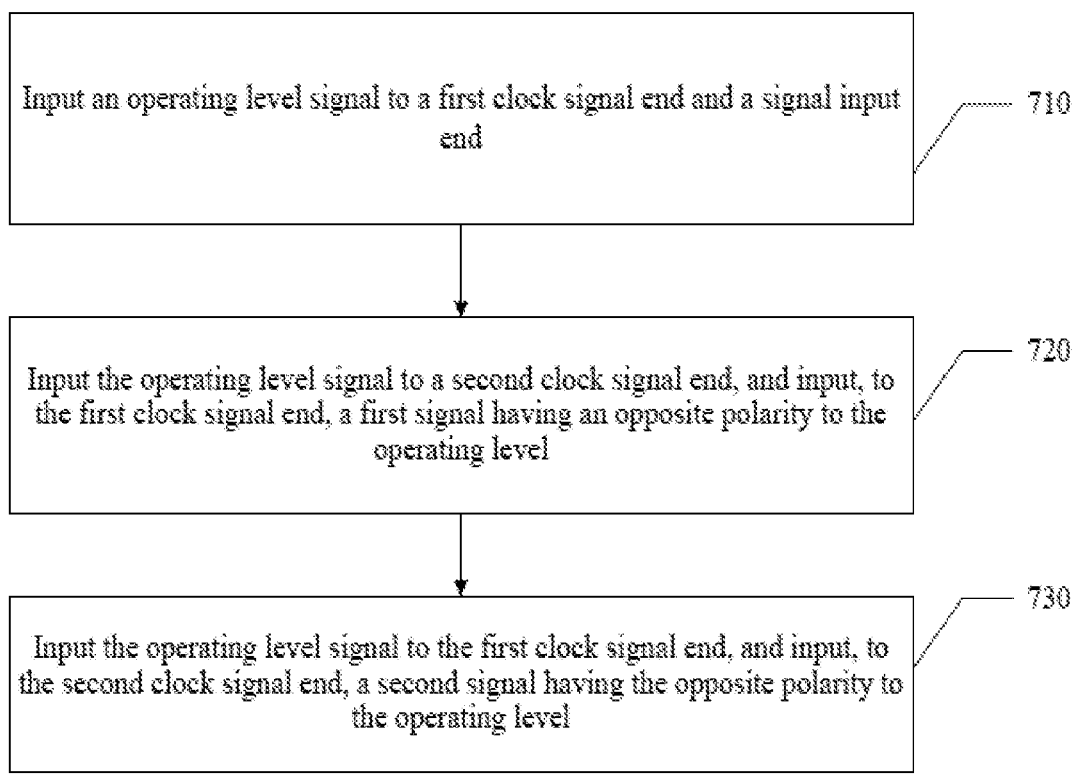
FIG. 7 shows an example of processing diagram of a method of driving a shift register.

FIG. 7 shows an example of processing diagram of a method of driving a shift register. As shown in FIG. 7, the method of driving a shifter register disclosed herein may include inputting an operating level signal to a first clock signal end and a signal input end 710; controlling, through a first control circuit, a first node to have a the same polarity as an operating level; controlling, through a second control circuit, a second node to have a same polarity as the first node; and controlling, through a third control circuit, a third node to have an opposite polarity to the first node.

The method may also include inputting the operating level signal to a second clock signal end, inputting, to the first clock signal end, a first signal having an opposite polarity to the operating level 720; controlling, through the second control circuit, the second node to have the opposite polarity to the operating level; controlling, through the third control circuit, the third node to have the same polarity as the operating level; and controlling, through the output control circuit, the signal output end to output an output signal having the same polarity as the operating level.

The method may further include inputting the operating level signal to the first clock signal end, inputting, to the second clock signal end, a second signal having the opposite polarity to the operating level 730; controlling, through the first control circuit, the first node to have the opposite polarity to the operating level; controlling, through the second control circuit, the second node to have the same polarity as the operating level; controlling, through the third control circuit, the third node to have the opposite polarity to the operating level; and controlling, through the output control circuit, the signal output end to output the output signal having the opposite polarity to the operating level.

It should be understood that, the above embodiments are exemplary embodiments merely adopted to illustrate the principle of the disclosure, and other examples are in the scope of this disclosure. For the ordinary staff in this art, multiple improvements and modifications may be made without departing from the spirit and essence of the disclosure, and these improvements and modifications shall fall into the scope of protection of the disclosure.

The invention claimed is:

1. A shift register comprising:
a first control circuit coupled to a signal input end, a first clock signal input end, a first level signal end, a first node and a third node, and configured to control, under control of a signal input by the first clock signal end and a voltage level of the third node, a voltage level of the first node according to signals from the first level signal end and the signal input end;
a second control circuit coupled to the first clock signal end, a second level signal end, the first node and a second node, and configured to control, under control of the signal input by the first clock signal end and the voltage level of the first node, a voltage level of the second node according to signals from the first clock signal end and the second level signal end;
a third control circuit coupled to a second clock signal end, the first level signal end, the first node, the second node and the third node, and is configured to control, under control of the voltage level of the first node and the voltage level of the second node, a voltage level of the third node according to signals from the second clock signal end and the first level signal end; and
an output control circuit coupled to the second clock signal end, the first level signal end, the first node, the second node and a signal output end, and configured to control, under control of the voltage level of the first node and the voltage level of the second node, a voltage level of the signal output end according to signals from the second clock signal end and the first level signal end.

2. The shift register according to claim 1, wherein the signal input by the first level signal end has an opposite polarity to an operating level, and the signal input by the second level signal end has a same polarity as the operating level.

3. The shift register according to claim 1, wherein the first control circuit comprises a first transistor having a first electrode connected to the first node, a second electrode connected to the signal input end, and a control electrode connected to the first clock signal end; and a second transistor having a first electrode connected to the first level signal end, a second electrode connected to the first node, and a control electrode connected to the third node.

4. The shift register according to claim 1, wherein the second control circuit comprises a fifth transistor having a first electrode connected to the first clock signal end, a second electrode connected to the second node, and a control electrode connected to the first node; and a sixth transistor has a first electrode connected to the second node, a second electrode connected to the second clock signal end, and a control electrode connected to the first clock signal end.

5. The shift register according to claim 1, wherein the third control circuit comprises a third transistor having a first electrode connected to the first level signal end, a second electrode connected to the third node, and a control electrode connected to the first node; and a fourth transistor having a first electrode connected to the third node, a second electrode connected to the second clock signal end, and a control electrode connected to the second node.

6. The shift register according to claim 1, wherein the output control circuit comprises a seventh transistor having a first electrode connected to the first level signal end, a second electrode connected to the signal output end, and a control electrode connected to the second node; and an eighth transistor having a first electrode connected to the signal output end, a second electrode connected to the second clock signal end, and a control electrode connected to the first node.

7. The shift register according to claim 6, wherein the output control circuit further comprises a first storage capacitor having a first end connected to the first node, and a second end connected to the signal output end.

8. The shift register according to claim 6, wherein the output control circuit further comprises a second storage capacitor having a first end connected to the first level signal end, and a second end connected to the second node.

9. The shift register according to claim 1, wherein the first control circuit comprises a first transistor and a second transistor, the second control circuit comprises a fifth transistor and a sixth transistor, the third control circuit comprises a third transistor and a fourth transistor, and the output control circuit comprises a seventh transistor and an eighth transistor, wherein:

the first transistor has a first electrode connected to the first node, a second electrode connected to the signal input end, and a control electrode connected to the first clock signal end;

the second transistor has a first electrode connected to the first level signal end, a second electrode connected to the first node and a control electrode connected to the third node;

the third transistor has a first electrode connected to the first level signal end, a second electrode connected to the third node, and a control electrode connected to the first node;

the fourth transistor has a first electrode connected to the third node, a second electrode connected to the second clock signal end, and a control electrode connected to the second node;

the fifth transistor has a first electrode connected to the first clock signal end, a second electrode connected to the second node, and a control electrode connected to the first node;

the sixth transistor has a first electrode connected to the second node, a second electrode connected to the second clock signal end, and a control electrode connected to the first clock signal end;

the seventh transistor has a first electrode connected to the first level signal end, a second electrode connected to the signal output end, and a control electrode connected to the second node; and the eighth transistor has a first electrode connected to the signal output end, an second electrode connected to the second clock signal end, and an control electrode connected to the first node.

10. The shift register according to claim 9, wherein the signal input by the first level signal end has an opposite polarity to an operating level, and the signal input by the second level signal end has a same polarity as the operating level, when the first transistor, the second transistor, the third transistor, the fourth transistor, the fifth transistor, the sixth transistor, the seventh transistor and the eighth transistor all are P type transistors, the operating level is a low level signal; and when the first transistor, the second transistor, the third transistor, the fourth transistor, the fifth transistor, the sixth transistor, the seventh transistor and the eighth transistor all are N type transistors, the operating level is a high level signal.

11. A method for driving the shift register according to claim 1, the method comprising:

inputting an operating level signal to a first clock signal end and a signal input end; controlling, through a first control circuit, a first node to have a same polarity as an operating level; controlling, through a second control circuit, a second node to have a same polarity as the first node; and controlling, through a third control circuit, a third node to have an opposite polarity to the first node;

inputting the operating level signal to a second clock signal end, inputting, to the first clock signal end, a first signal having an opposite polarity to the operating level; controlling, through the second control circuit, the second node to have the opposite polarity to the operating level; controlling, through the third control circuit, the third node to have the same polarity as the operating level; and controlling, through the output control circuit, the signal output end to output an output signal having the same polarity as the operating level; and inputting the operating level signal to the first clock signal end, inputting, to the second clock signal end, a second signal having the opposite polarity to the operating level; controlling, through the first control circuit, the first node to have the opposite polarity to the operating level; controlling, through the second control circuit, the second node to have the same polarity as the operating level; controlling, through the third control circuit, the third node to have the opposite polarity to the operating level; and controlling, through the output control circuit, the signal output end to output the output signal having the opposite polarity to the operating level.

12. A grid driving circuit, comprising a plurality of shift registers according to claim 1 that are in cascaded connection.

13. A display device, comprising a grid driving circuit according to claim 12.

14. The display device of claim 13, wherein the signal input by the first level signal end has an opposite polarity to an operating level, and the signal input by the second level signal end has a same polarity as the operating level.

15. The display device of claim 13, wherein the first control circuit comprises
   a first transistor having a first electrode connected to the first node, a second electrode connected to the signal input end, and a control electrode connected to the first clock signal end; and
   a second transistor having a first electrode connected to the first level signal end, a second electrode connected to the first node, and a control electrode connected to the third node.

16. The display device of claim 13, wherein the second control circuit comprises
   a fifth transistor having a first electrode connected to the first clock signal end, a second electrode connected to the second node, and a control electrode connected to the first node; and
   a sixth transistor has a first electrode connected to the second node, a second electrode connected to the second clock signal end, and a control electrode connected to the first clock signal end.

17. The display device of claim 13, wherein the third control circuit comprises
   a third transistor having a first electrode connected to the first level signal end, a second electrode connected to the third node, and a control electrode connected to the first node; and
   a fourth transistor having a first electrode connected to the third node, a second electrode connected to the second clock signal end, and a control electrode connected to the second node.

18. The display device of claim 13, wherein the output control circuit comprises
   a seventh transistor having a first electrode connected to the first level signal end, a second electrode connected to the signal output end, and a control electrode connected to the second node; and
   an eighth transistor having a first electrode connected to the signal output end, a second electrode connected to the second clock signal end, and a control electrode connected to the first node.

19. The display device of claim 18, wherein the output control circuit further comprises a first storage capacitor having a first end connected to the first node, and a second end connected to the signal output end.

20. The display device of claim 18, wherein the output control circuit further comprises a second storage capacitor having a first end connected to the first level signal end, and a second end connected to the second node.

* * * * *